US008053963B2

(12) United States Patent
Kim et al.

(10) Patent No.: US 8,053,963 B2
(45) Date of Patent: Nov. 8, 2011

(54) DISPLAY DEVICE AND OPTICAL FILTER

(75) Inventors: Jae-Hyung Kim, Suwon-si (KR);
Sung-Yong Lee, Suwon-si (KR);
Jin-Young Lee, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 0 days.

(21) Appl. No.: 12/620,583

(22) Filed: Nov. 17, 2009

(65) Prior Publication Data
US 2010/0134893 A1   Jun. 3, 2010

(30) Foreign Application Priority Data

Dec. 1, 2008   (KR) .................. 10-2008-0120664

(51) Int. Cl.
*H01J 5/02*   (2006.01)
*H01K 1/28*   (2006.01)
(52) U.S. Cl. ........................ 313/112; 313/111
(58) Field of Classification Search .............. 313/112, 313/111
See application file for complete search history.

(56) References Cited

U.S. PATENT DOCUMENTS

| | | | | |
|---|---|---|---|---|
| 7,119,479 | B2 * | 10/2006 | Hori et al. ................ | 313/110 |
| 2005/0099122 | A1 * | 5/2005 | Wan et al. ................ | 313/582 |
| 2008/0088215 | A1 * | 4/2008 | Park et al. ................ | 313/112 |
| 2008/0160263 | A1 | 7/2008 | Cho et al. | |
| 2008/0220225 | A1 | 9/2008 | Moon et al. | |
| 2008/0225423 | A1 | 9/2008 | Hur et al. | |
| 2009/0256781 | A1 * | 10/2009 | Kwon et al. ................ | 345/60 |

FOREIGN PATENT DOCUMENTS

| | | |
|---|---|---|
| KR | 1020020076724 A | 10/2002 |
| KR | 1020040040048 A | 5/2004 |
| KR | 1020040040049 A | 5/2004 |
| KR | 10-0740227 B1 | 7/2007 |
| KR | 1020070071943 A | 7/2007 |

OTHER PUBLICATIONS

Search Report dated Mar. 22, 2010 of the corresponding European Patent Application No. 09176887.9.
SIPO Office action dated Jul. 1, 2011, for corresponding Chinese Patent application 200910247129.1, with English translation, 7 pages.

* cited by examiner

*Primary Examiner* — Joseph L Williams
*Assistant Examiner* — Nathaniel Lee
(74) *Attorney, Agent, or Firm* — Christie, Parker & Hale, LLP

(57) ABSTRACT

A display device according to one embodiment of the invention includes a display panel for displaying an image and an optical filter attached to the display panel. The optical filter includes an external light anti-reflection layer, a color compensation layer, an external light shielding layer, and an electromagnetic interference (EMI) shielding layer. The external light shielding layer includes a barrier rib unit including black photoresist at a gap between the EMI shielding layer and the external light anti-reflection layer or the color compensation layer, for partitioning the gap.

18 Claims, 6 Drawing Sheets

DISPLAY DEVICE AND OPTICAL FILTER

CROSS-REFERENCE TO RELATED APPLICATION

This application claims priority to and the benefit of Korean Patent Application No. 10-2008-0120664 filed in the Korean Intellectual Property Office on Dec. 1, 2008, the entire contents of which are incorporated herein by reference.

BACKGROUND OF THE INVENTION

1. Field of the Invention

An aspect of the present invention relates to a display device and an optical filter. More particularly, an aspect of the present invention relates to a display device and an optical filter with reduced manufacturing costs.

2. Description of the Related Art

Generally, an optical filter for a display device controls optical characteristics of a display panel, for example, luminance, color temperature, color coordinates, external light anti-reflection, reflective luminance and reflective color, while being positioned between the display panel and a viewer.

For example, a glass filter can form an external light anti-reflection layer and a color compensation layer on a front surface of a glass substrate, and can form an electromagnetic wave (electro-magnetic interference, EMI) shielding layer on a rear surface of the glass substrate.

In order to simplify the structure of the glass filter and reduce the manufacturing costs thereof, some optical filters in the conventional art include an integrated filter attached directly to the display panel.

For example, an integrated filter may include, in order from the outside-in, an external light anti-reflection layer.

The external light shielding layer conventionally includes a transparent film layer and a black material.

Thus, when forming the external light shielding layer, the integrated filter typically uses two materials, and therefore has a limitation in reducing the manufacturing costs thereof.

Furthermore, the integrated filter may have a limitation in the pattern shape of the black matrix that can be implemented because of the black material.

Also, the integrated filter may have a limitation in optical characteristics such as transmittance, refraction and haze, and in physical characteristics such as impact resistance, thermal conductivity and noise because of the transparent film.

The above information disclosed in this Background section is only for enhancement of understanding of the background of the invention and therefore it may contain information that does not form the prior art that is already known in this country to a person of ordinary skill in the art.

SUMMARY OF THE INVENTION

In one aspect, an exemplary embodiment according to the present invention provides a display device and an optical filter with reduced manufacturing costs.

In another aspect, an exemplary embodiment according to the present invention provides a display device and an optical filter including a black matrix pattern of a barrier rib unit formed of black photoresist.

In yet another aspect, an exemplary embodiment according to the present invention provides a display device and an optical filter having improved optical characteristics and physical characteristics.

One exemplary embodiment of the present invention is a display device including a display panel for displaying an image and an optical filter attached to the display panel. The optical filter includes an external light anti-reflection layer, a color compensation layer, an external light shielding layer, and an electromagnetic interference (EMI) shielding layer, where the external light shielding layer includes a barrier rib unit including black photoresist at a gap between the EMI shielding layer and the external light anti-reflection layer or the color compensation layer, for partitioning the gap. In some embodiments, the barrier rib unit further includes a black pigment.

The barrier rib unit may have a stripe pattern or a matrix pattern.

The EMI shielding layer may be on the display panel in a mesh, and the barrier rib unit may be on the EMI shielding layer in a matrix pattern.

The unit lattice of the matrix pattern in the barrier rib unit may be larger than the unit lattice of the mesh in the EMI shielding layer.

In some embodiments, the unit lattice of the mesh in the EMI shielding layer has a rhombic shape (e.g., a rhombus), and the unit lattice of the matrix pattern in the barrier rib unit has a rectangular shape (e.g., a rectangle), wherein one side of the rhombus may be formed to be longer than a longer side of the rectangle.

The barrier rib unit may include an outer side part on the EMI shielding layer, and an inner side part that protrudes toward the display panel from the outer side part.

The outer side part may be attached to the external light anti-reflection layer or the color compensation layer with an adhesive layer.

The barrier rib unit has a minimum width on the outer side part and has a maximum width on the inner side part, wherein the barrier rib unit tapers from the inner side part to the outer side part.

Another exemplary embodiment of the present invention is an optical filter including an external light anti-reflection layer, a color compensation layer, an external light shielding layer, and an EMI shielding layer. In this embodiment, the external light shielding layer includes a barrier rib unit including black photoresist at a gap between EMI shielding layer and the external light anti-reflection layer or the color compensation layer for partitioning the gap.

DESCRIPTION OF REFERENCE NUMERALS INDICATING PRIMARY ELEMENTS IN THE DRAWINGS

Figure 1:
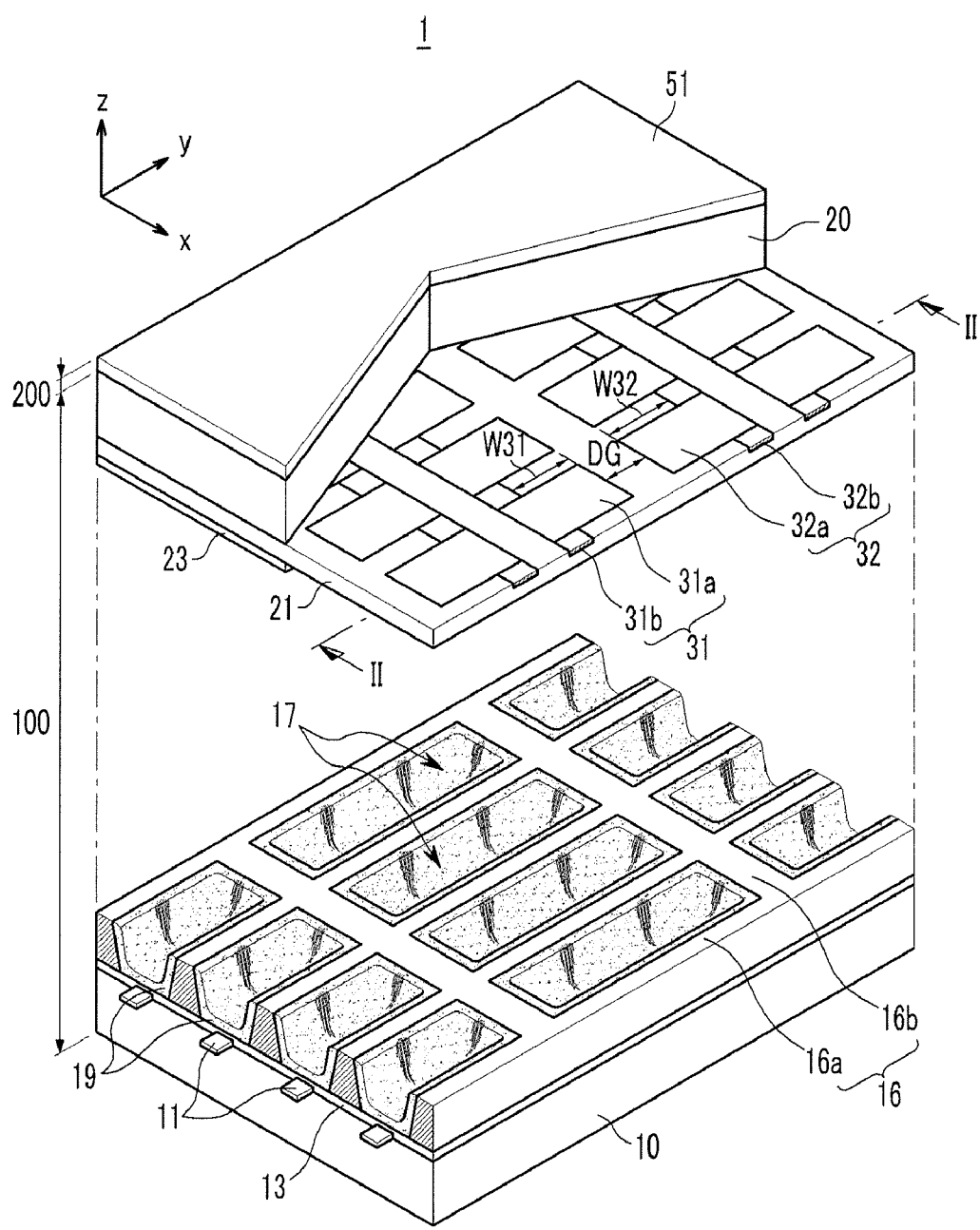
FIG. 1 is an exploded perspective view of a display device according to an exemplary embodiment of the present invention.

1: display device
100: plasma display panel
200: optical filter
10, 20: rear substrate, front substrate
11: address electrodes
13, 21: first and second dielectric layers
16: PDP barrier rib
17: discharge cells
19: phosphor layer
31: first electrodes (sustain electrodes)
32: second electrodes (scan electrodes)
210: external light anti-reflection layer
220: color compensation layer
230: external light shielding layer
231: air layer
232: barrier rib unit
232a: outer side part
232b: inner side part
240: EMI shielding layer
S: space
Wmin: minimum width
Wmax: maximum width

DETAILED DESCRIPTION OF EMBODIMENTS

An aspect of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention. The drawings and description are to be regarded as illustrative in nature and not restrictive. Like reference numerals designate like elements throughout the specification.

According to various embodiments of the present invention, a display panel is one or more of several different devices for displaying an image. For example, the display panel may be a plasma display panel (PDP), a liquid crystal display (LCD) or a field emission display (FED), among others.

For convenience, the present exemplary embodiment will be described mainly based on a plasma display panel (PDP) 100.

Figure 2:
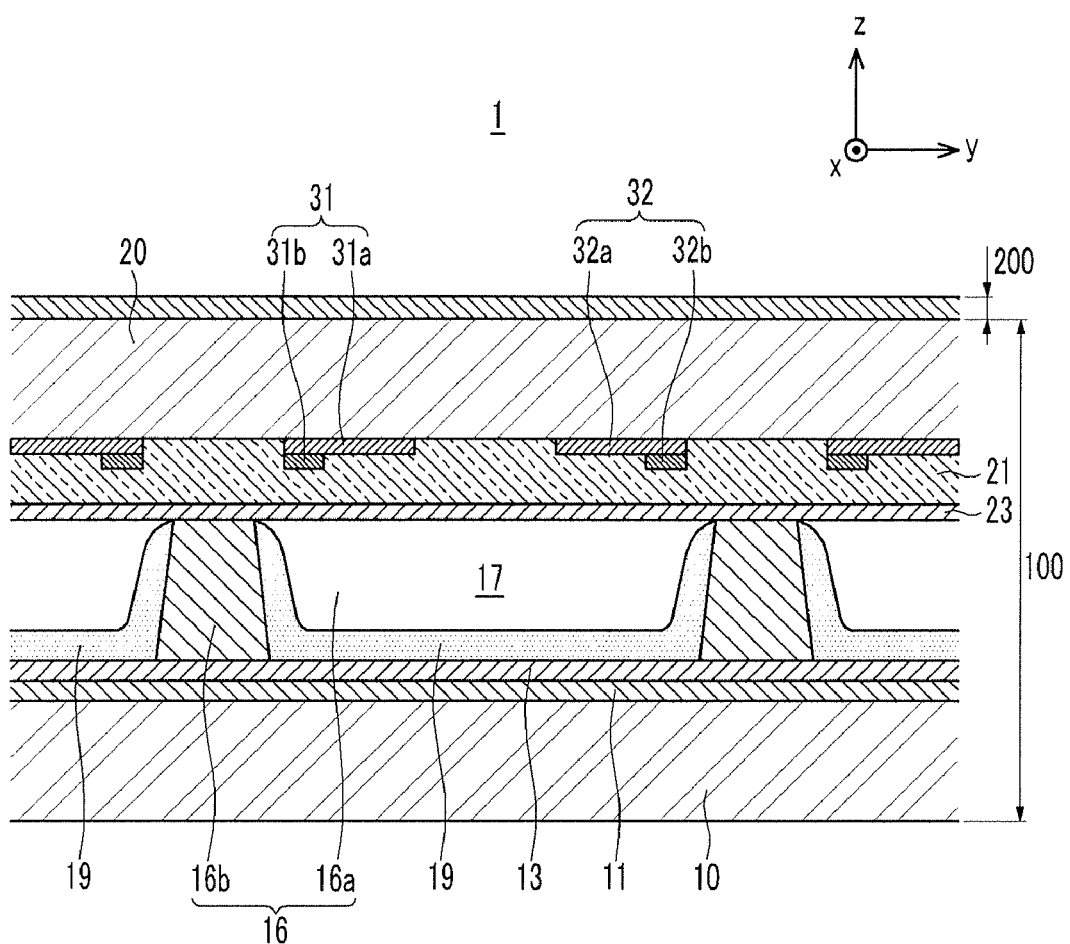
FIG. 2 is a cross-sectional view taken along the line II-II of FIG. 1.

FIG. 1 is an exploded perspective view of a display device according to an exemplary embodiment of the present invention, and FIG. 2 is a cross-sectional view taken along the line II-II of FIG. 1.

Referring to FIGS. 1 and 2, the display device 1 according to an exemplary embodiment includes a plasma display panel 100 and an optical filter 200.

The plasma display panel 100 includes a rear substrate 10 and a front substrate 20, opposed to each other and sealed, and a PDP barrier rib 16 that partitions the space between the substrates 10 and 20 to form discharge cells 17.

The discharge gas (for example, mixed gas including neon (Ne) and xenon (Xe), etc.) is electrically excited in the discharge cells 17 to generate vacuum ultraviolet (VUV) rays at the time of a gas discharge.

A phosphor layer 19 is formed in the discharge cells 17 to absorb the vacuum ultraviolet (VUV) rays to emit visible light.

In order to implement the gas discharge, the plasma display panel 100 includes address electrodes 11 disposed between the rear substrate 10 and the front substrate 20 corresponding to the respective discharge cells 17, first electrodes (hereinafter referred to as "sustain electrodes") 31, and second electrodes (hereinafter referred to as "scan electrodes") 32.

For example, the address electrodes 11 are elongated along a first direction (y axis direction in the drawing) on the inner surface of the rear substrate 10 to be continuously disposed on the adjacent discharge cells 17 in the y-axis direction.

A first dielectric layer 13 covers the address electrodes 11 and the inner surface of the rear substrate 10. The first dielectric layer 13 prevents positive ions or electrons from contacting directly with the address electrodes 11 at the time of the gas discharge to prevent the address electrodes 11 from being damaged, and provides a space for forming and accumulating wall charges.

The address electrodes 11 are disposed on the rear substrate 10 so that they do not prevent the visible light from being emitted forward. Thus, the address electrodes 11 may be formed as opaque electrodes, that is, metal electrodes having an excellent electrical conductivity.

The PDP barrier ribs 16 partition the face of the first dielectric layer 13 on the rear substrate 10 to form discharge cells 17.

The PDP barrier ribs 16 include first PDP barrier rib members 16a elongated in the y-axis direction and second PDP barrier rib members 16b elongated in an x-axis direction and disposed at intervals between the first PDP barrier rib members 16a.

Therefore, the discharge cells 17 form a matrix structure.

In another embodiment, the PDP barrier ribs 16 may consist entirely of the first PDP barrier rib members that are elongated in the y-axis direction.

Therefore, the discharge cells may be formed in a stripe structure (not shown).

The phosphor layer 19 is formed on the respective discharge cells 17. In other words, the phosphor layer 19 is formed by coating, drying and baking phosphor paste to the side surfaces of the PDP barrier rib 16 and the surface of the first dielectric layer 13 surrounded by the PDP barrier ribs 16.

The phosphor layer 19 is formed of phosphors that emit visible light having the same color in the discharge cells formed along the y-axis direction.

As to the arrangement of the discharge cells 17 along the x-axis direction, the phosphor layer 19 is formed by repeatedly disposing three phosphors that implement the red (R), green (G) and blue (B) visible light.

Figure 3:
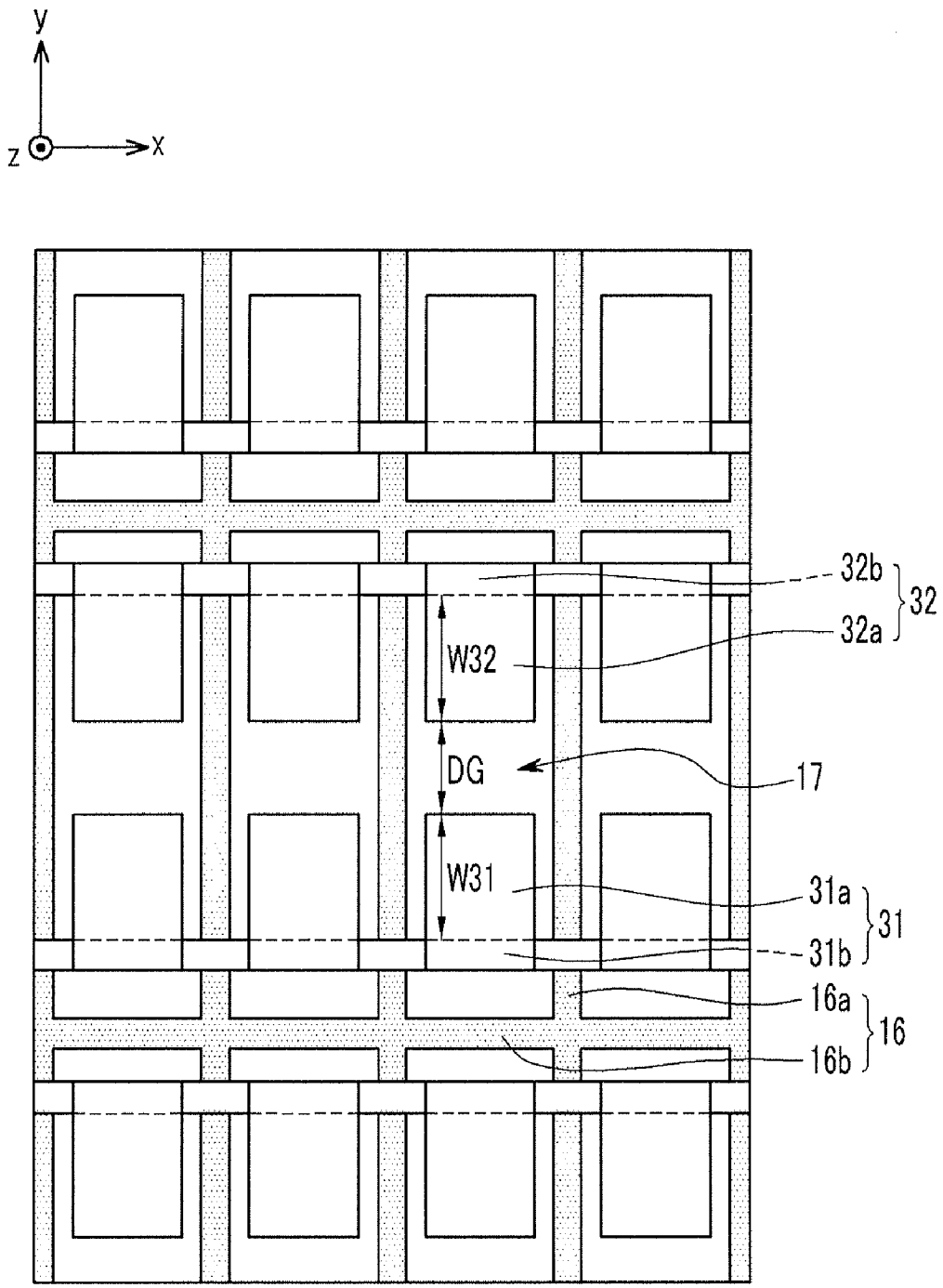
FIG. 3 is a top plan view of FIG. 1.

FIG. 3 is a top plan view of FIG. 1.

Referring to FIG. 3, the sustain electrodes 31 and the scan electrodes 32 are elongated on the inner surface of the front substrate 20 along the second direction (an x-axis direction in the drawing) crossing the first direction to be continuously disposed on the adjacent discharge cells 17 in the x-axis direction.

Also, the sustain electrodes 31 and the scan electrodes 32 have a surface discharge structure, such that a pair of the sustain and scan electrodes face each other along the y-axis direction, corresponding to the respective discharge cells 17.

The sustain electrodes 31 and the scan electrodes 32 include transparent electrodes 31a and 32a that cause electric discharging and bus electrodes 31b and 32b that apply voltage signals to the transparent electrodes 31a and 32a, respectively.

The transparent electrodes 31a and 32a, which are portions to cause a surface discharge inside the discharge cells 17, are formed of a transparent material (for example, Indium Tim Oxide (ITO)) in order to improve the aperture ratio of the discharge cells 17.

The bus electrodes 31b and 32b are formed of metal material having an excellent electrical conductivity in order to compensate for a relatively high electrical resistance of the transparent electrodes 31a and 32a.

The transparent electrodes 31a and 32a protrude from a periphery of the discharge cells 17 to a central portion thereof along the y-axis direction to have respective widths W31 and W32, and form a discharge gap DG in the central portion of each discharge cells 17.

The bus electrodes 31b and 32b are disposed on the transparent electrodes 31a and 32a along the outer portions of the discharge cells 17 in the y-axis direction, extending in the x-axis direction. If the voltage signals are applied to the bus electrodes 31b and 32b, the voltage signals are applied to the transparent electrodes 31a and 32a connected to the respective bus electrodes 31b and 32b.

Referring again to FIGS. 1 and 2, a second dielectric layer 21 covers the inner surface of the front substrate 20, the sustain electrodes 31 and the scan electrodes 32.

The second dielectric layer 21 protects the sustain electrodes 31 and the scan electrodes 32 from the gas discharge, and provides a space for forming and accumulating wall charges at the time of discharge.

The protective layer 23 covers the second dielectric layer 21.

For example, a protective layer 23 includes transparent MgO that protects the second dielectric layer 21 and increases a secondary electron emission coefficient at the time of discharge.

For example, when the PDP 100 is driven, reset discharges occur by reset pulses applied to the scan electrodes 32 during a reset period.

Address discharges occur by scan pulses applied to the scan electrodes 32 and address pulses applied to the address electrodes 11 during a scan period (an address period) following the reset period.

Thereafter, sustain discharges occur by sustain pulses applied to the sustain electrodes 31 and the scan electrodes 32 during a sustain period.

The sustain electrodes 31 and the scan electrodes 32 are used to apply the sustain pulses required for the sustain discharges.

The scan electrodes 32 are used to apply the reset pulses and the scan pulses.

The address electrodes 11 are used to apply the address pulses.

The sustain electrodes 31, the scan electrodes 32 and the address electrodes 11 may have different functions depending on voltage waveforms each applied thereto, and they are not always limited to the above uses or functions.

In the plasma display panel 100, the discharge cells 17 to be turned on are selected by controlling the address discharges that occur by the interaction between the address electrodes 11 and the scan electrodes 32, and the selected discharge cells 17 are driven by utilizing the sustain discharges that occur by the interaction between the sustain electrodes 31 and the scan electrodes 32 disposed on the selected discharge cells 17, thereby displaying an image.

The optical filter 200, which is attached to the front substrate 20 of the plasma display panel 100, is constituted to enable a reduction of manufacturing costs, to enable various patterns for the barrier rib unit 232, and to improve optical characteristics and physical characteristics.

Figure 4:
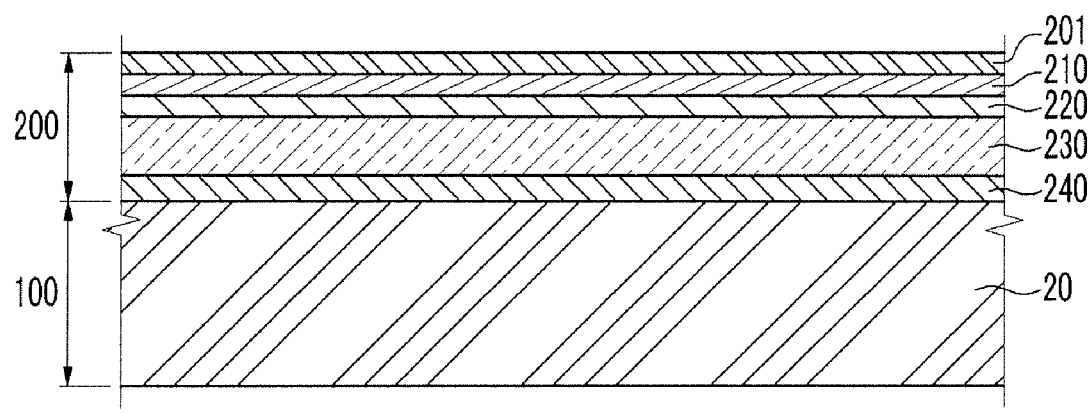
FIG. 4 is an enlarged cross-sectional view of an optical filter according to an exemplary embodiment of the present invention.

FIG. 4 is an enlarged cross-sectional view of an optical filter according to an exemplary embodiment of the present invention. The layers of FIG. 4 are not necessarily drawn to scale.

Referring to FIG. 4, the optical filter 200 of this embodiment includes an external light anti-reflection layer 210, a color compensation layer 220, an external light shielding layer 230, and an EMI shielding layer 240.

A tempered glass layer 201 is provided on the front surface of the optical filter 200.

The tempered glass layer 201 protects the plasma display panel 100 and functions as a substrate of the optical filter 200 having a multi-layer structure.

The external light anti-reflection layer 210 prevents external light from being reflected on the surface of the plasma display panel 100.

For example, as the external light anti-reflection method, there are an anti-reflection (AR) treatment and an anti-glare (AG) treatment.

The antireflection (AR) treatment forms a hard coating (HC) layer on a film surface and makes an optical thin film layer (for example, having a thickness of 100 nm) having a different refractive index and having multiple layers (for example, 2-5 layers), thereby reducing reflectivity of the surface by the effects of light interference.

The anti-glare (AG) treatment forms micro protrusions and depressions on the surface of the hard coating layer to scatter the external light (scattered reflection), thereby reducing reflection of the external light.

The plasma display panel 100 generates some light of unnecessary wavelengths (for example, visible light generated from the discharge of neon gas, and near infrared rays), so the display quality is improved by the absorption of the unnecessary wavelengths.

In order to absorb the wavelengths of the neon light or the near infrared rays, the color compensation layer 220 is formed by coating a pigment that absorbs the appropriate wavelengths.

The bright room contrast ratio of the plasma display panel 100 depends on the reflective luminance of the display panel under external light (for example, 150 Lux), wherein the bright room contrast ratio increases as the reflective luminance is lowered.

The external light shielding layer 230 is formed to lower the reflective luminance of the plasma display panel 100 by blocking external light, while maintaining an suitable transmittance.

This feature will be described in more detail below.

The EMI generated from the plasma display panel 100 should be reduced to a suitable level (e.g., a predetermined level).

However, if the EMI shielding function is increased, the transmittance of visible light is lowered.

Therefore, the EMI shielding layer 240 is adapted to strike a suitable balance between the shielding rate and transmittance.

For example, in some embodiments the EMI shielding layer 240 attaches a film coated with transparent conductive material to the plasma display panel 100, or in other embodiments, is formed of a metal mesh layer.

Hereinafter, an embodiment including an EMI shielding layer 240 formed of metal mesh will be described by way of example.

For example, the external light anti-reflection layer 210, the color compensation layer 220, the external light shielding layer 230, and the EMI shielding layer 240 are disposed sequentially, from the outermost portion of the optical filter 200 to the plasma display panel 100.

In some embodiments, the external light shielding layer 230 is disposed between the external light anti-reflection layer 210 and the EMI shielding layer 240. However, in the present exemplary embodiment, the external light shielding layer 230 is disposed between the color compensation layer 220 and the EMI shielding layer 240 in the present exemplary embodiment and thus it will be described thereon.

Figure 5:
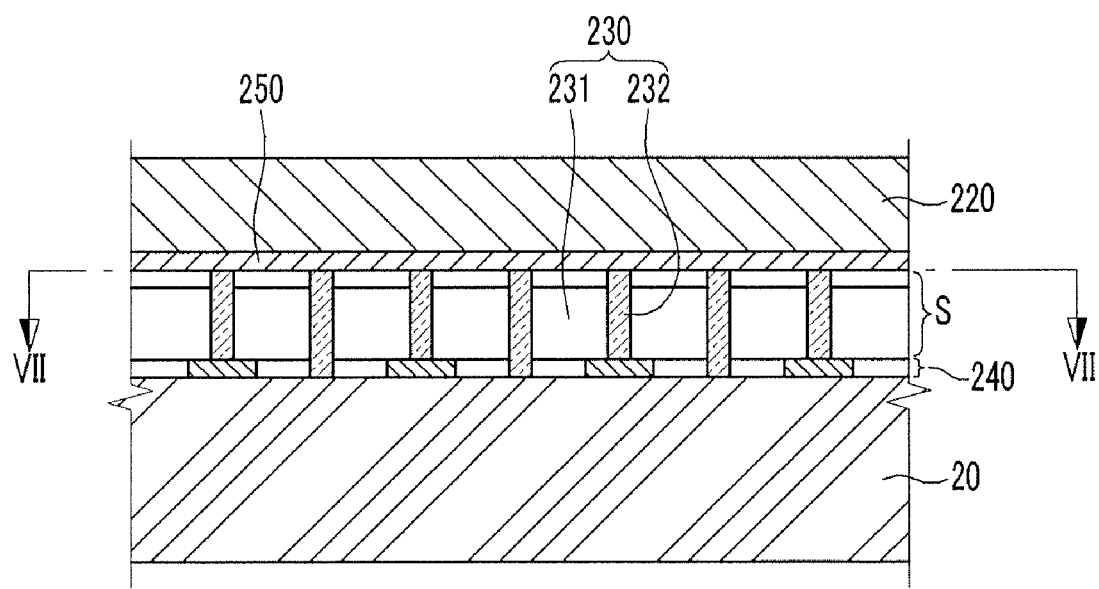
FIG. 5 is an enlarged cross-sectional view of the external light shielding layer of FIG. 4.

FIG. 5 is an enlarged cross-sectional view illustrating the external light shielding layer 230 of FIG. 4.

Referring to FIG. 5, the external light shielding layer 230 includes a transparent air layer 231 and a barrier rib unit 232 that forms a black matrix by utilizing black photoresist in order to block the external light, while maintaining the transmittance of visible light.

The photoresist allows the barrier rib unit 232 to have various black matrix patterns through a simple exposure process.

In the external light shielding layer 230, the barrier rib unit 232 is disposed in a space S between the color compensation layer 220 and the EMI shielding layer 240 to partition the space S into the air layer 231 that has a plurality of air cells.

The air layer 231 maintains the appropriate transmittance of the visible light (for example, 100% transmittance of air) and the barrier rib unit 232 is formed in a black matrix structure to block the external light and lower the reflective luminance of the plasma display panel 100, thereby improving the bright room contrast ratio.

Also, the air layer 231 reduces the refractive index (for example, 1 refractive index of air) and haze (for example, 0% haze of air).

The air layer 231 is formed along the barrier rib unit 232, and the barrier rib unit 232 is formed of black photoresist that includes a black pigment.

The photoresist is generally an inexpensive material, leading to a reduction in the manufacturing costs of the external light shielding layer 230 and the optical filter 200.

Figure 6:
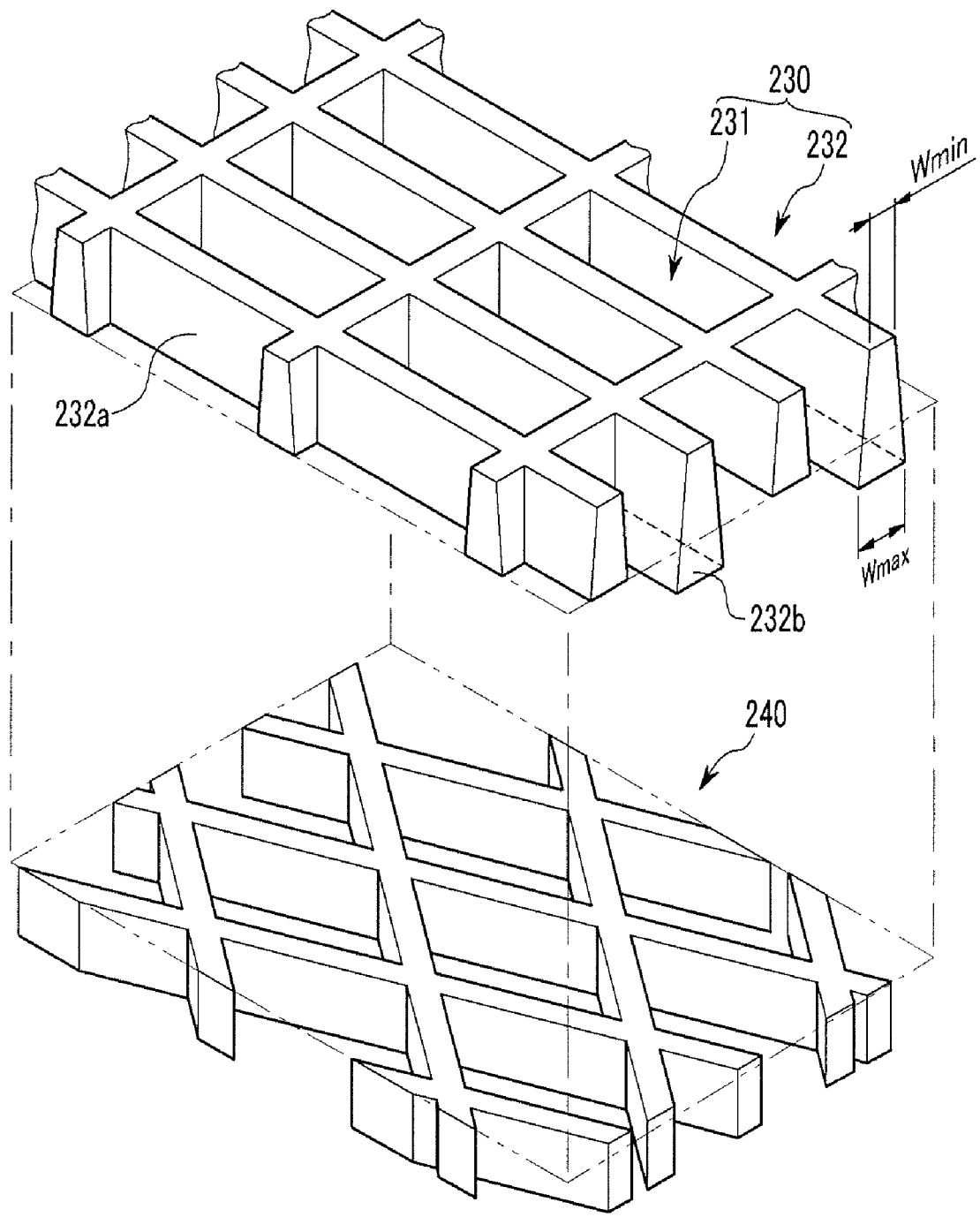
FIG. 6 is an exploded perspective view of the external light shielding layer and the EMI shielding layer of FIG. 5.
Figure 7:
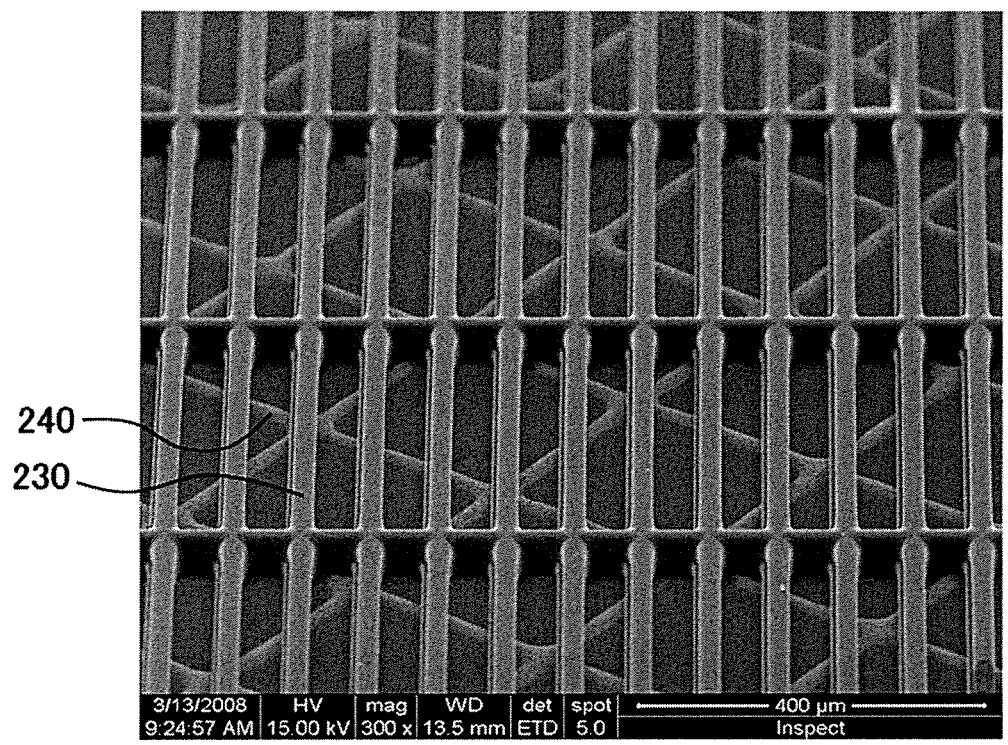
FIG. 7 is a photograph shown from the line VII-VII of FIG. 5.

FIG. 6 is an exploded perspective view of the external light shielding layer 230 and the EMI shielding layer 240 of FIG. 5, and FIG. 7 is a photograph shown from lines VII-VII of FIG. 5.

Referring to FIGS. 6 and 7, the barrier rib unit 232 may be formed in a stripe pattern (not shown) or in a matrix pattern.

The EMI shielding layer 240 in the illustrated embodiment is formed on the display panel in a metal mesh to shield the EMI emitted from the display panel 200 and allow the EMI to be grounded on the chassis base (not shown).

The barrier rib unit 232 is formed on the EMI shielding layer 240 in a matrix pattern.

The barrier rib unit 232 is formed of black photoresist to absorb and block the external light.

For example, the unit lattice of the mesh in the EMI shielding layer 240 is formed to be larger than the unit lattice of the matrix pattern in the barrier rib unit 232.

More specifically, the unit lattice of the mesh in the EMI shielding layer 240 is formed in a rhombic shape (e.g., a rhombus), and the unit lattice of the matrix pattern in the barrier rib unit 232 is formed in a rectangular shape (e.g., a rectangle).

At this time, each side of the rhombus is formed to be larger than the longer side of the rectangle.

In other words, the EMI shielding layer 240 has the smallest unit lattice within the desirable range for sufficient transmittance of visible light to maximize the shielding of the EMI, and the barrier rib unit 232 increases or maximizes the absorption and blocking of the external light, while reducing or minimizing the blocking of the visible light transmitted through the EMI shielding layer 240.

The EMI shielding layer 240 and the barrier rib unit 232 may be formed in a coinciding pattern, for example, having the same matrix pattern or the same stripe pattern (not shown).

When forming the matrix pattern, the barrier rib unit 232 includes an outer side part 232a formed on an outer side (e.g., an upper side facing outward from the display device) and an inner side part 232b formed on an inner side (e.g., a lower side facing inward to the display device).

The outer side part 232a and the inner side part 232b are utilized in this embodiment because the EMI shielding layer 240 has a mesh structure, which does not have a single smooth surface.

In other words, the outer side part 232a is formed on an outer side of the EMI shielding layer 240, and the inner side part 232b protrudes inward from the outer side part 232a extending toward the plasma display panel 100.

The outer side part 232a is a portion of the external light shielding layer 230 that is formed from the outermost surface of the EMI shielding layer 240 facing the outside of the display device 1, and the inner side part 232b is a portion of the external light shielding layer 230 that is formed from the outermost surface of the EMI shielding layer 240 facing the inside of the display device 1. Therefore, in some embodiments the plasma display panel 100 side of the external light shielding layer 230 is formed directly on the front substrate 20, without requiring a separate adhesive.

As illustrated in FIG. 5, the outer side part 232a is attached to the color compensation layer 220 by an adhesive layer 250.

Of course, when the positions of the color compensation layer 220 and the external light anti-reflection layer 210 are changed, on the external light shielding layer 230 the outer side part 232a of the barrier rib unit may be attached to the external light anti-reflection layer 210 through the adhesive layer 250 (not shown).

In view of the cross-sectional structure, the barrier rib unit 232 has a minimum width Wmin on the outer side part 232a and a maximum width Wmax on the inner side part 232b, where the barrier rib unit tapers from the inner side part 232b to the outer side part 232a (see FIG. 6).

The external light shielding layer 230 has physical characteristics of air by the air layer 231, making it possible to improve impact resistance, to block the radiation of inner heat, and to greatly contribute to the deterioration of the display due to electrical noise.

Also, the external light shielding layer 230 and the barrier rib unit 232 are formed of substantially the same material, making it possible to reduce the manufacturing costs. Furthermore, in some embodiments the adhesive layer 250 is not needed on the plasma display panel 100 side of the external light shielding layer 230, making it possible to simplify the structure.

In order to highlight some of the effects of the present exemplary embodiment, the comparison of the structure and the effects between the external light shielding layer in the conventional art and the external light shielding layer 230 in the present exemplary embodiment will be represented by the following Table 1.

TABLE 1

Comparison of the structure and the effects between the external light shielding layer in the conventional art and the external light shielding layer in an exemplary embodiment

| | | conventional art external light shielding layer | exemplary embodiment external light shielding layer |
|---|---|---|---|
| black | material pattern | black pigment impossible to form pattern using passive black pigment | black photoresist easily possible to form pattern using active photoresist and exposure process |
| white (transparent) | material optical characteristics | PET, optical film transmittance: within 90% (optical film) refractive index: 1.5-1.6 (PET) haze: within 5% (PET) | air layer transmittance: 100% (air layer) refractive index: 1 (air layer) haze: 0% (air layer) |
| | physical characteristics | Physical characteristics according to film material Impact resistance: weak thermal conductivity: discharge of inner heat noise: low contribution to deterioration of noise | gas(air layer) physical characteristics impact resistance: high blocking inner heat using heating layer noise: high contribution to deterioration of noise |
| | cost adhesive layer | PET, black pigment: high cost adhesive layer is required on both sides of external light shielding layer | black photoresist: low cost adhesive is not required on one side of external light shielding layer |

As described above, with the exemplary embodiment of the present invention, the external light shielding layer disposed between any one of the external light anti-reflection layer, the color compensation layer, and the EMI shielding layer is formed of an air layer and a barrier rib unit formed of black photoresist, making it possible to reduce the manufacturing costs thereof.

The barrier rib unit is formed of black photoresist, making it possible to implement the black matrix of the barrier rib unit using various patterns through a simple exposure process.

Also, the barrier rib unit partitions the gap to create an air layer having a plurality of air cells, improving the optical characteristics and the physical characteristics of the display device.

In other words, in view of the optical characteristics, the transmittance can be improved and the refractive index and the haze can be deteriorated, and in view of the physical characteristics, the impact resistance can be improved physically and the thermal conductivity and the noise can be deteriorated.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising:
a display panel for displaying an image; and
an optical filter attached to the display panel, the optical filter comprising an external light anti-reflection layer, a color compensation layer, an external light shielding layer, and an electromagnetic interference (EMI) shielding layer,
wherein the external light shielding layer comprises a barrier rib unit comprising black photoresist at a gap between the EMI shielding layer and the external light anti-reflection layer or the color compensation layer, for partitioning the gap into air-filled cells.

2. The display device of claim 1, wherein the barrier rib unit further comprises a black pigment.

3. The display device of claim 1, wherein the barrier rib unit has a stripe pattern or a matrix pattern.

4. The display device of claim 1, wherein the EMI shielding layer is on the display panel in a mesh, and the barrier rib unit is on the EMI shielding layer in a matrix pattern.

5. The display device of claim 4, wherein a unit lattice of the matrix pattern in the barrier rib unit is larger than a unit lattice of the mesh in the EMI shielding layer.

6. The display device of claim 5, wherein the unit lattice of the mesh in the EMI shielding layer has a rhombic shape, the unit lattice of the matrix pattern in the barrier rib unit has a rectangular shape, and a side of the rhombic shape is longer than a longer side of the rectangular shape.

7. The display device of claim 5, wherein the barrier rib unit comprises an outer side part on the EMI shielding layer and an inner side part that protrudes toward the display panel from the outer side part.

8. The display device of claim 7, wherein the outer side part is attached to the external light anti-reflection layer or the color compensation layer with an adhesive layer.

9. The display device of claim 7, wherein the barrier rib unit has a minimum width on the outer side part and has a maximum width on the inner side part, and wherein the barrier rib unit tapers from the inner side part to the outer side part.

10. An optical filter comprising an external light anti-reflection layer, a color compensation layer, an external light shielding layer, and an EMI shielding layer,
wherein the external light shielding layer comprises a barrier rib unit comprising black photoresist at a gap between the EMI shielding layer and the external light anti-reflection layer or the color compensation layer, for partitioning the gap into air-filled cells.

11. The optical filter of claim 10, wherein the barrier rib unit further comprises a black pigment.

12. The optical filter of claim 10, wherein the barrier rib unit has a stripe pattern or a matrix pattern.

13. The optical filter of claim 10, wherein the EMI shielding layer is a mesh, and the barrier rib unit is on the EMI shielding layer in a matrix pattern.

14. The optical filter of claim 13, wherein a unit lattice of the matrix pattern in the barrier rib unit is larger than a unit lattice of the mesh in the EMI shielding layer.

15. The optical filter of claim 14, wherein the unit lattice of the mesh in the EMI shielding layer has a rhombic shape, the unit lattice of the matrix pattern in the barrier rib unit has a rectangular shape, and a side of the rhombic shape is longer than a longer side of the rectangular shape.

16. The optical filter of claim 14, wherein the barrier rib unit comprises an outer side on the EMI shielding layer and an inner side protruding from the outer side.

17. The optical filter of claim 16, wherein the outer side is attached to the external light anti-reflection layer or the color compensation layer with an adhesive layer.

18. The optical filter of claim 16, wherein the barrier rib unit has a minimum width on the outer side and has a maximum width on the inner side, and wherein the barrier rib unit tapers from the inner side to the outer side.

* * * * *